United States Patent
Choi et al.

(10) Patent No.: US 7,214,963 B2
(45) Date of Patent: May 8, 2007

(54) 3-D COLUMN SELECT CIRCUIT LAYOUT IN SEMICONDUCTOR MEMORY DEVICES

(75) Inventors: Byung-Gil Choi, Gyeonggi-do (KR); Young-Ho Suh, Kyunggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 114 days.

(21) Appl. No.: 11/206,437

(22) Filed: Aug. 18, 2005

(65) Prior Publication Data

US 2006/0138465 A1 Jun. 29, 2006

(30) Foreign Application Priority Data

Dec. 24, 2004 (KR) .................. 10-2004-0111632

(51) Int. Cl.
*H01L 29/10* (2006.01)
(52) U.S. Cl. .................. 257/67; 257/74; 257/351; 257/903

(58) Field of Classification Search .................. 257/67, 257/74, 351, 369, 393, 903
See application file for complete search history.

(56) References Cited

U.S. PATENT DOCUMENTS

| | | | |
|---|---|---|---|
| 5,525,814 A * | 6/1996 | Malhi | .................. 257/67 |
| 2001/0050442 A1 | 12/2001 | Lee | |
| 2004/0007746 A1 | 1/2004 | Zhang | |

* cited by examiner

*Primary Examiner*—Mark V. Prenty
(74) *Attorney, Agent, or Firm*—Myers, Bigel, Sibley & Sajovec, P.A.

(57) ABSTRACT

A column select circuit in a Static Random Access Memory (SRAM) having a three-dimensional layout can include a lower CMOS layer in a substrate and an upper NMOS layer above the lower layer. An intermediate PMOS layer is located between the upper NMOS layer and the lower CMOS layer.

30 Claims, 3 Drawing Sheets

3-D COLUMN SELECT CIRCUIT LAYOUT IN SEMICONDUCTOR MEMORY DEVICES

CROSS-REFERENCE TO RELATED APPLICATION

This application claims the benefit of Korean Patent Application No. 2004-111632, filed Dec. 24, 2004, the disclosure of which is hereby incorporated herein by reference in its entirety.

FIELD OF THE INVENTION

The present invention relates to semiconductor memory devices and, more particularly, to column select circuits in volatile semiconductor memory device.

BACKGROUND

To keep pace with the capability of electronic systems, such as personal computers and electronic communication devices, volatile semiconductor memory devices (such as static random access memories (SRAMs)) can be made faster and more highly integrated. Accordingly, the layout of memory cells and functional circuits connected to the memory cells can be arranged according to a scaled-down critical dimension. It is known that the layout of circuit lines in a functional circuit region of an SRAM may be a factor in the integration thereof. The functional circuit region is sometimes referred to as a peripheral circuit region, namely, a cell core region, which is adjacent to a cell region including scaled-down memory cells. The functional circuit region can include a column path circuit (also referred to as a column select circuit, which can operate as part of a column address decoder) functioning as an interface circuit that drives a unit memory cell.

In the case where a design rule is less than 80 nanometers, normally, six transistors of a full CMOS SRAM cell may be laid out on different layers (i.e., in three dimensions) rather than on the same layer. As a result, if the cell pitch of the SRAM cell is further scaled down to a resolution limitation of a photolithography process, it may be difficult to layout the P- and N-type metal oxide semiconductor (MOS) transistors (such as P1 to P4 and N1 to N4) constituting the column path circuit, and the lines 10 and 11, PBL0 to PBL3, and GBL connected thereto as shown in FIG. 1.

Thus, as semiconductor memory devices become faster and more highly integrated, there may be a need for more efficient layout of circuits. In particular, with the advent of a so-called three-dimensional memory cells in which transistors constituting the SRAM memory cell are laid out on different layers, the cell core region which is connected to the memory cell, may need to be implemented in a smaller area without the degradation of functionality of the memory cell circuit.

SUMMARY

Embodiments according to the invention can provide 3-D column select circuit layout in semiconductor memory devices. Pursuant to these embodiments, a column select circuit in a Static Random Access Memory (SRAM) having a three-dimensional layout can include a lower CMOS layer in a substrate and an upper NMOS layer above the lower layer. An intermediate PMOS layer is located between the upper NMOS layer and the lower CMOS layer.

In some embodiments according to the invention, the upper NMOS layer includes first and second separate active areas in which respective NMOS transistors are formed. In some embodiments according to the invention, the first and second separate active areas define an opening therebetween which electrically isolates the separate active areas. The circuit can further include a VDD power supply voltage line extending through the opening to the intermediate PMOS layer and electrically coupled thereto.

In some embodiments according to the invention, the intermediate PMOS layer includes first and second PMOS transistors wherein the VDD power supply voltage line is electrically coupled to respective source regions of the first and second PMOS transistors. In some embodiments according to the invention, drain regions of the first and second PMOS transistors are electrically coupled to first and second partial bit lines.

In some embodiments according to the invention, drain regions of first and second NMOS transistors included in the separate active areas are electrically coupled to the first and second partial bit lines. In some embodiments according to the invention, the first and second PMOS transistors are first and second precharge transistors. In some embodiments according to the invention, the first and second NMOS transistors are first and second switching transistors configured to switch data from the SRAM to first and second partial bit lines.

In some embodiments according to the invention, the intermediate and upper layers are electrically isolated from one another. In some embodiments according to the invention, the intermediate and upper layers comprise first and second crystallized silicon layers.

In some embodiments according to the invention, there is provided a column path circuit layout in a semiconductor memory device, the semiconductor memory device having a column path circuit for enabling one of a plurality of partial bit lines to be operatively connected to one global bit line, the column path circuit layout comprising: a metal oxide semiconductor (MOS) layer formed in a substrate; a second layer over the MOS layer for forming precharge transistors; and a third layer for forming path switching transistors, the third layer being divided and formed over the second layer other than a region through which a contact of a power line for supplying a power to the second layer passes.

In some embodiments according to the invention, the second layer and the third layer may be electrically isolated from each other, each being a crystallized silicon layer, and the region through which the contact passes may be a region through a tungsten contact plug passes without making an electrical short-circuit. The precharge transistors may be P-type MOS transistors, and the path switching transistors may be N-type MOS transistors. The second layer and the third layer may be active regions of the transistors, and the tungsten contact plug may have a function of electrically connecting between a source of the precharge transistor and the power line. The semiconductor memory device may include a plurality of static memory cells each having six transistors laid out in a three-dimension, and the MOS layer may be an N-type active region for a floating node.

DESCRIPTION OF EMBODIMENTS ACCORDING TO THE INVENTION

Figure 1:
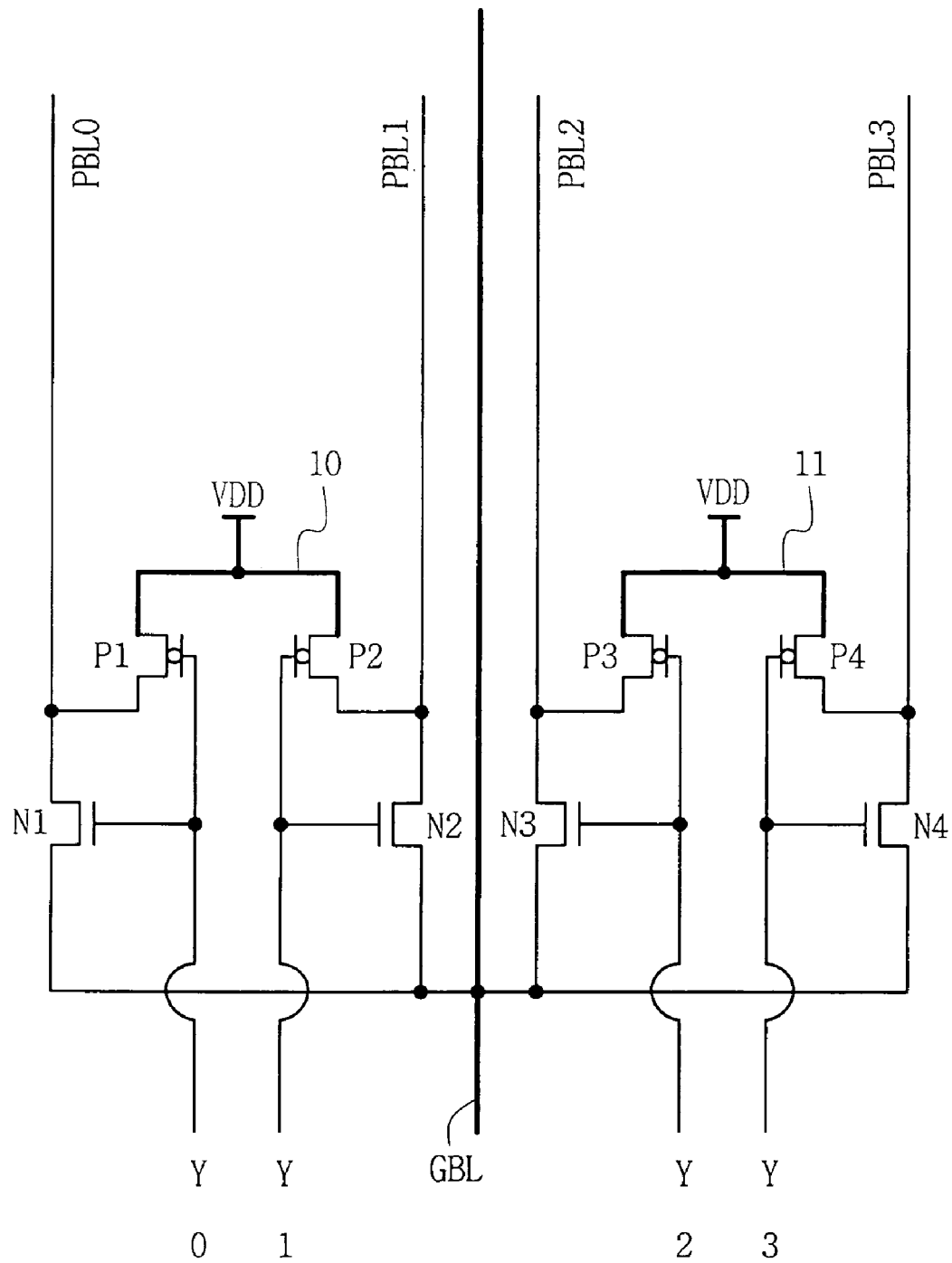
FIG. 1 illustrates a conventional column path circuit.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" would then be oriented as "upper". Thus, the exemplary term "lower" can encompass both an orientation of upper and lower. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
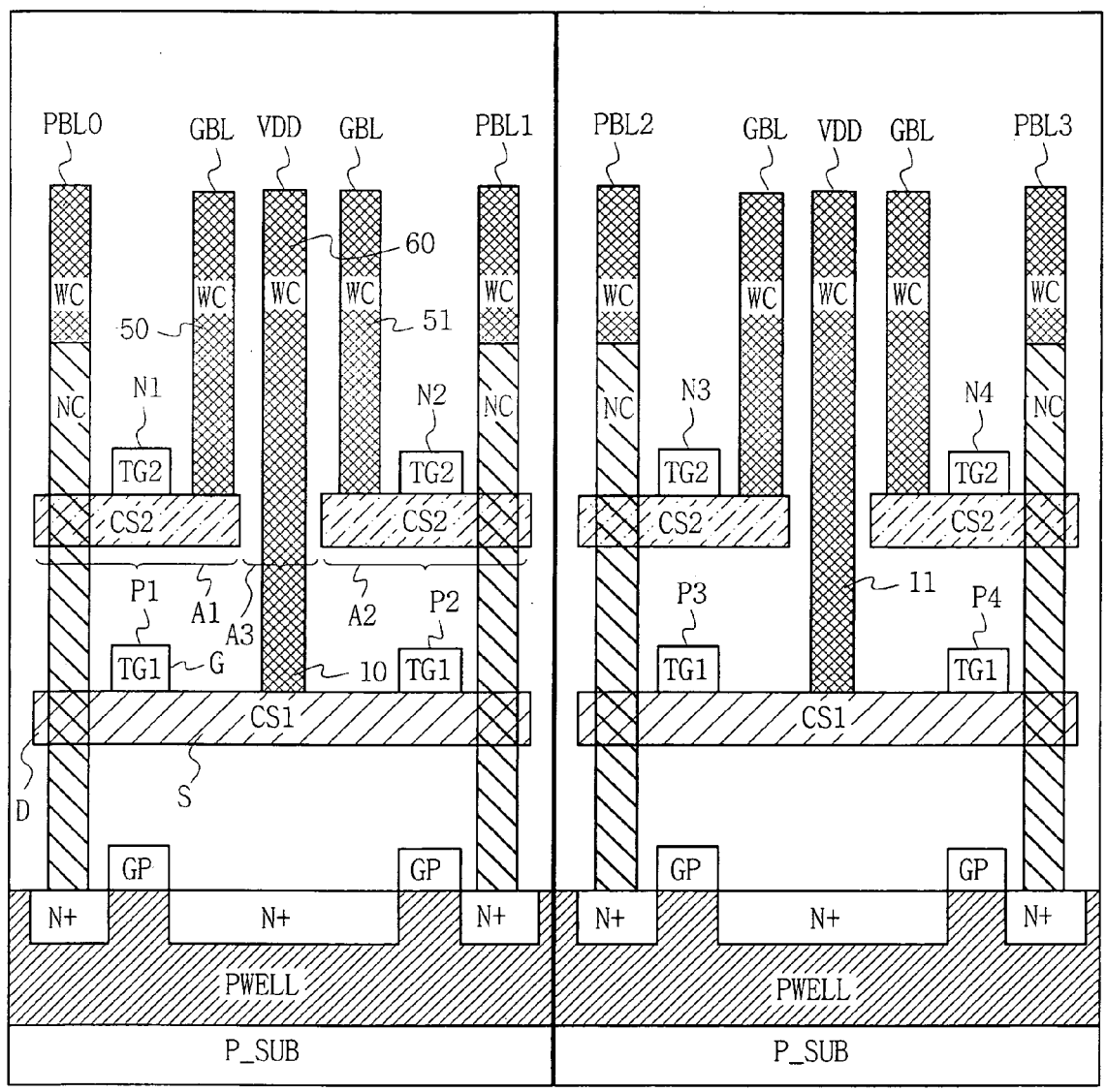
FIG. 2 is a sectional view of a column path circuit in some embodiments according to the present invention.
Figure 3:
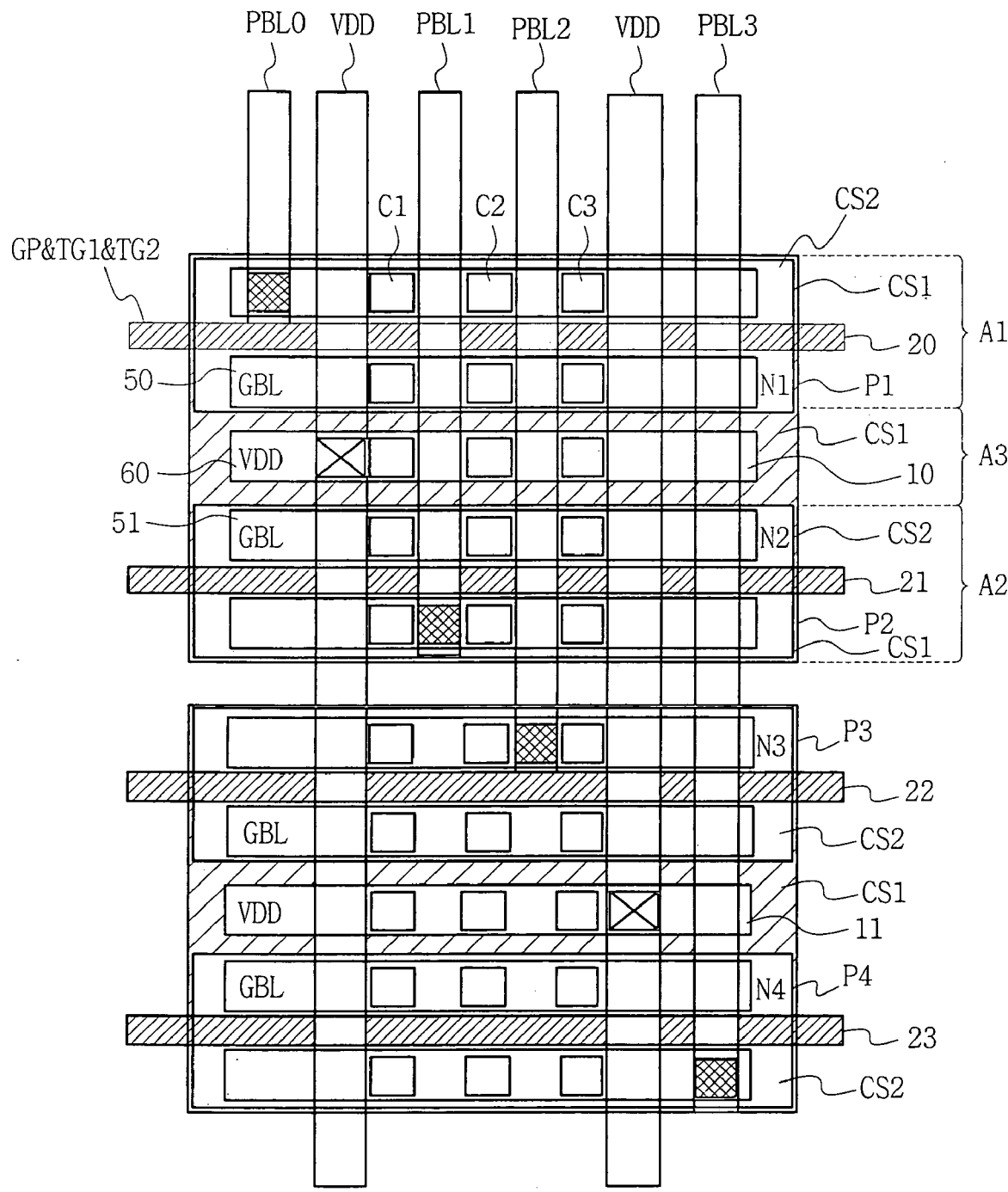
FIG. 3 is a plan layout view showing the section of FIG. 2.

FIG. 2 is a sectional view of a column path circuit implemented according to some embodiments of the present invention, and FIG. 3 is a plan layout view showing the section of FIG. 2. FIG. 2 shows a schematic sectional structure taken by cutting the plan layout of FIG. 3 in a longitudinal direction of the figure. It will be understood that the embodiments illustrated herein may provide the same functions as the conventional column select circuit shown in FIG. 1, but may have the layout(s) illustrated by FIGS. 2 and 3.

Referring to FIGS. 2 and 3, MOS layer having an N-type impurity region and a polysilicon gate (GP: commonly called "gate poly" by those skilled in the art) is formed as a first layer (sometimes referred to herein as a lower layer) in a p-type well of a p-type substrate, and a second layer CS1 (sometimes referred to herein as an intermediate layer) for forming precharge transistors P1 to P4 is laid out over the MOS layer. Further, a third layer CS2 (sometimes referred to herein as an upper layer) for forming path switching transistors N1 to N4 is divided, formed and laid out over the second layer other than a region A3 through which a contact WC of a power line 10 for supplying a power supply voltage VDD to the second layer CS1 passes.

In FIG. 3, reference numerals C1, C2 and C3 indicate contacts for electrical connections between a lower portion and an upper portion. A gate poly GP, a first top gate TG1, and a second top gate TG2 as shown in a leftmost side of FIG. 2 appear as a gate line 20 shown in a top of FIG. 3. A gate line 21 of FIG. 3 indicates gates of the transistors P2 and N2. Power lines VDD, which are perpendicularly laid out in parallel with each other in FIG. 3, are connected to the power lines 10 and 11 of FIG. 1 via contacts to apply the power supply voltage, respectively. The power lines 10 and 11 of FIG. 1 are laid out under the power lines VDD and perpendicularly to the power lines VDD in FIG. 3. For the power supply voltage which is applied to the power lines 10 and 11 of FIG. 1 to be applied to the sources of the P-type transistors P1 to P4 with a minimized power loss, this embodiment employs a structure in which the third layer CS2 has an opening corresponding to the width of a region A3 shown in FIG. 3.

The MOS layer functions as a floating node for electrically isolating adjacent partial bit lines from each other and is a layer including a high concentration N-type active region. The second layer CS1 and the third layers CS2 may be made of a crystallized silicon layer by selective epitaxial growth (SEG) or solid phase epitaxy (SPE).

It will be understood that the four global bit lines 50, 51, 53 and 54 shown in FIGS. 2 and 3, can correspond to the single global bit line GBL shown in FIG. 1 as the four global bit lines 50, 51, 53 and 54 in FIGS. 2 and 3 refers to the connections from the source/drain nodes of switching transistors N1 to N4 to the single global bit line GBL. It is noted in this discussion that the four partial bit lines PBL0 to PBL3 shown in FIG. 1 can correspond to the partial bit lines shown in FIG. 3 and, in FIG. 2, the partial bit lines are labeled as the tungsten contact plugs WC for convenience.

Referring to FIG. 2, in some embodiments according to the invention, the column path circuit of FIG. 1 is formed in a three-layered (or 3-D) structure. When the static memory cell is implemented into a three-dimensional memory cell, such a three-layered structure may be more suitable because a fabrication process may be used in common.

In some embodiments according to the invention, when the active regions of the first and second N-type MOS transistors N1 and N2 are formed as the second crystallized silicon layer CS2 which is formed over the first crystallized silicon layer CS1, the second crystallized silicon layer CS2 is divided into two separate active regions with a boundary therebetween being a contact region A3 which is formed for applying the power supply voltage VDD to the first crystallized silicon layer CS1. An oblique line portion which is positioned in a line-symmetrical manner under the region A3 as shown in FIG. 3 indicates the first crystallized silicon layer CS1 which is exposed as the second crystallized silicon layer CS2 is divided into the two regions.

Referring to FIG. 2, there is shown that the second crystallized silicon layer CS2 is divided into a first partial region A1 and a second partial region A2, with the boundary therebetween being the region A3. The power supply voltage VDD, which is supplied via the contact forming region A3, is applied to the sources of the P-type MOS transistors P1 to P4 via the power lines 10 and 11, as shown in FIG. 1. In some embodiments according to the present invention, the transistors included in the column path circuit are laid out in a three-layered structure, thus allowing a power feed and efficient layout within the limited area.

As described above, it can be seen that, in the case where part of the column path circuit is configured by laminating and laying out the first and second MOS transistors P1 and P2 of the first conduction type in FIG. 1 and the first and second MOS transistors N1 and N2 of the second conduction type on different conductive substrate layers, the first and second MOS transistors P1 and P2 having sources connected to the power supply voltage VDD in parallel, drains connected to the first and second corresponding partial bit lines PBL0 and PBL1, respectively, and gates for receiving the first and second column select signals Y0 and Y1, respectively; and the first and second MOS transistors N1 and N2 having gates and drains connected to the corresponding drains and gates of the first and second MOS transistors P1 and P2 of the first conduction type, respectively, and sources connected to the global bit line GBL in common, the first and second MOS transistors P1 and P2 of the first conduction type share one active region S which is formed on the first conduction type substrate layer CS1 while the first and second MOS transistors N1 and N2 of the second conduction type are laid out in the divided active regions A1 and A2 of the second conduction type substrate layer CS2, respectively, with the boundary therebetween being the contact region A3 for power feed.

The gate pattern shown in FIGS. 2 and 3 may provide less variation of critical dimension of the gate poly, which may be used in a photolithography process of 80 nanometers or less. Accordingly, the layout of column select circuits according to some embodiments of the invention may allow a suitable implementation of a high-performance circuit in a relatively small-area via a photo-lithography process.

As described above, laying out the column path circuit within the functional circuit region may provide greater margin for the layout. It may allow the transistors in the column path circuit and the lines within the functional circuit region to be more efficiently laid out within a limited size even when the cell pitch is scaled down. Further, the novel layout of the column path circuit as described above may allow the circuit elements and the lines to be suitably laid out according to the cell pitch of the memory cell which is highly integrated in a three-dimension.

It will be understood by those skilled in the art that the concept suggested herein may be applied to specific application examples in several other ways. The suggested number of the transistors in the column path circuit is part of the embodiment according to the present invention, and many other methods available to circuit designers may be applied. Accordingly, it should be construed that detailed implementations thereof are included in the present invention and are not departed from the scope of the appended claims.

Meanwhile, the invention has been described using preferred exemplary embodiments. It will be apparent that various variations may be made to the present invention without departing from the scope of the present invention. For example, the layer layout of the P-type MOS transistors and the N-type MOS transistors may be changed through modification to the illustrated embodiment. Further, the technical spirit of the present invention may be expanded to a three-dimensional layout of transistors constituting other functional circuits, as well as the layout of the transistors constituting the column path circuit.

What is claimed:

1. A column select circuit in a Static Random Access Memory (SRAM) having a three-dimensional layout, the column select circuit comprising:
    a lower CMOS layer in a substrate;
    an upper NMOS layer above the lower layer; and
    an intermediate PMOS layer between the upper NMOS layer and the lower CMOS layer.

2. A circuit according to claim 1 wherein the upper NMOS layer comprises first and second separate active areas in which respective NMOS transistors are formed.

3. A circuit according to claim 2 wherein the first and second separate active areas define an opening therebetween which electrically isolates the separate active areas, the circuit further comprising:
    a VDD power supply voltage line extending through the opening to the intermediate PMOS layer and electrically coupled thereto.

4. A circuit according to claim 3 wherein the intermediate PMOS layer includes first and second PMOS transistors wherein the VDD power supply voltage line is electrically coupled to respective source regions of the first and second PMOS transistors.

5. A circuit according to claim 4 wherein drain regions of the first and second PMOS transistors are electrically coupled to first and second partial bit lines.

6. A circuit according to claim 5 wherein drain regions of first and second NMOS transistors included in the separate active areas are electrically coupled to the first and second partial bit lines.

7. A circuit according to claim 4 wherein the first and second PMOS transistors comprise first and second precharge transistors.

8. A circuit according to claim 4 wherein the first and second NMOS transistors comprise first and second switching transistors configured to switch data from the SRAM to first and second partial bit lines.

9. A circuit according to claim 1 wherein the intermediate and upper layers are electrically isolated from one another.

10. A circuit according to claim 9 wherein the intermediate and upper layers comprise first and second crystallized silicon layers.

11. A column path circuit layout in a semiconductor memory device, the semiconductor memory device comprising a column path circuit for enabling one of a plurality of partial bit lines to be operatively connected to one global bit line, the column path circuit layout comprising:
a metal oxide semiconductor (MOS) layer as a first layer formed in a substrate;
a second layer over the MOS layer for forming precharge transistors; and
a third layer for forming path switching transistors, the third layer being divided and formed over the second layer other than a region through which a contact of a power line for supplying a power to the second layer passes.

12. The layout according to claim 11, wherein the second layer and the third layer are electrically isolated from each other, each being a crystallized silicon layer.

13. The layout according to claim 11, wherein the region through which the contact passes is a region through a tungsten contact plug passes without making an electrical short-circuit.

14. The layout according to claim 11, wherein the precharge transistors are P-type MOS transistors.

15. The layout according to claim 14, wherein the path switching transistors are N-type MOS transistors.

16. The layout according to claim 11, wherein the second layer and the third layer are active regions of the transistors.

17. The layout according to claim 13, wherein the tungsten contact plug electrically connects between a source of the precharge transistor and the power line.

18. The layout according to claim 11, wherein the semiconductor memory device comprises a plurality of static memory cells each having six transistors laid out in a three-dimension.

19. The layout according to claim 11, wherein the MOS layer is an N-type active region for a floating node.

20. A column path circuit layout in a semiconductor memory device, wherein:
when first and second P-type metal oxide semiconductor (MOS) transistors and first and second N-type MOS transistors constitute part of the column path circuit, the first and second P-type MOS transistors having sources connected to a power supply voltage in parallel, drains connected to first and second corresponding partial bit lines, respectively, and gates for receiving first and second column select signals, respectively, and the first and second N-type MOS transistors having drains and gates connected to the corresponding drains and gates of the first and second P-type MOS transistors, respectively, and sources connected to a global bit line in common,
the first and second P-type MOS transistors have active regions formed as a first silicon layer which is formed over an MOS layer,
the first and second N-type MOS transistors have active regions formed as a second silicon layer which is formed over the first silicon layer, and
the second silicon layer is divided into two with a boundary therebetween being a contact region formed for applying the power supply voltage to the first silicon layer.

21. The layout according to claim 20, wherein the first and second silicon layers are isolated electrically from each other, each being a crystallized silicon layer.

22. The layout according to claim 20, wherein the contact region is a region through which a tungsten contact plug passes without making an electrical short-circuit.

23. The layout according to claim 22, wherein the first and second P-type MOS transistors are transistors for precharging the partial bit lines.

24. The layout according to claim 22, wherein the first and second N-type MOS transistors are column path switching transistors connected to the global bit line.

25. The layout according to claim 24, wherein the MOS layer is an N-type active region for a floating node.

26. The layout according to claim 25, wherein the semiconductor memory device comprises a plurality of static memory cells each having six transistors laid out in a three-dimension.

27. The layout according to claim 22, wherein the tungsten contact plug electrically connects between a source of the precharge transistor and the power line.

28. A column path circuit layout in a semiconductor memory device, wherein:
when part of the column path circuit is configured by laminating and laying out first and second metal oxide semiconductor (MOS) transistors of a first conduction type and first and second MOS transistors of a second conduction type on different conductive substrate layers, the first and second MOS transistors having sources connected to a power supply voltage in parallel, drains connected to first and second corresponding partial bit lines, respectively, and gates for receiving first and second column select signals, respectively, and the first and second MOS transistors having drains and gates connected to the corresponding drains and gates of the first and second MOS transistors of the first conduction type, respectively, and sources connected to a global bit line in common,
the first and second MOS transistors of the first conductive type share one active region which is formed on the first conductive substrate layer while the first and second MOS transistors of the second conductive type are laid out in divided active regions of the second conductive substrate layer, respectively, with a boundary therebetween being a contact region for power feed.

29. The layout according to claim 28, wherein the contact region for power feed is a region through which a tungsten contact plug passes without making an electrical short-circuit.

30. The layout according to claim 28, wherein the second conductive substrate layer is a crystallized silicon layer which is insulatedly formed over the first conductive substrate layer, and an MOS layer is formed on a P-type substrate and under the first conductive substrate layer.

* * * * *